(12) United States Patent
Madathil et al.

(10) Patent No.: US 6,278,236 B1
(45) Date of Patent: Aug. 21, 2001

(54) ORGANIC ELECTROLUMINESCENT DEVICES WITH ELECTRON-INJECTING LAYER HAVING ALUMINUM AND ALKALI HALIDE

(75) Inventors: Joseph K. Madathil, Rochester; Max G. Mason, Fairport; Ching W. Tang, Rochester, all of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/387,402

(22) Filed: Sep. 2, 1999

(51) Int. Cl.[7] .......................................... H01J 1/62
(52) U.S. Cl. ............................. 313/504; 313/506
(58) Field of Search ................................... 313/498, 504, 313/506

(56) References Cited

U.S. PATENT DOCUMENTS

| | | |
|---|---|---|
| 4,356,429 | 10/1982 | Tang . |
| 4,539,507 | 9/1985 | VanSlyke et al. . |
| 4,720,432 | 1/1988 | VanSlyke et al. . |
| 4,769,292 | 9/1988 | Tang et al. . |
| 4,885,211 | 12/1989 | Tang et al. . |
| 5,047,687 | 9/1991 | VanSlyke . |
| 5,429,884 | 7/1995 | Namiki et al. . |
| 5,677,572 | 10/1997 | Hung et al. . |
| 5,739,653 | * 4/1998 | Wakimoto ........................ 313/504 |
| 6,198,219 | * 3/2001 | Arai et al. ........................ 313/504 |

* cited by examiner

Primary Examiner—Vip Patel
(74) Attorney, Agent, or Firm—Raymond L. Owens

(57) ABSTRACT

An organic electroluminescent (EL) device having a layered structure, including an anode; an organic hole-transport layer in contact with the anode; an organic emitting layer having one surface thereof in contact with the hole-transport layer; an organic electron-transport layer in contact with a second surface of the emitting layer; an electron-injecting layer in contact with the electron-transport layer; and a cathode in contact with the electron-injecting layer, wherein the electron-injecting layer includes aluminum and at least one alkali halide or at least one alkaline earth halide.

48 Claims, 3 Drawing Sheets

US 6,278,236 B1

ORGANIC ELECTROLUMINESCENT DEVICES WITH ELECTRON-INJECTING LAYER HAVING ALUMINUM AND ALKALI HALIDE

FIELD OF THE INVENTION

The present invention relates generally to electroluminescent (EL) devices, and more particularly to organic EL devices having a layered structure which provides an efficient electron-injecting layer.

BACKGROUND OF THE INVENTION

Organic electroluminescent (EL) devices, also referred to as organic light-emitting devices, contain spaced electrodes separated by an organic light-emitting structure (also referred to as an organic EL medium) which emits light in response to the application of an electrical potential difference across the electrodes.

In recent years, preferred organic EL devices have been constructed by employing thin film deposition techniques. Using an anode as the device support, the organic EL medium is deposited as one or a combination of thin films followed by the deposition of a cathode, also formed as a thin film deposition. Thus, starting with the anode structure, it is possible to form the entire active structure of an organic EL device by thin film deposition techniques. Examples of organic EL, devices containing organic EL medium and cathode constructions formed by thin film deposition are provided by commonly-assigned U.S. Pat. Nos. 4,356,429; 4,539,507; 4,720,452; and 4,769,292.

While the art has encountered little difficulty in constructing fully acceptable stable anodes for the organic EL devices, cathode construction has been a matter of extended investigation. In selecting a cathode material, a balance must be struck between materials having the highest electron-injecting efficiencies and those having the highest levels of stability. The highest electron-injecting efficiencies are obtained with alkali metals, which are too unstable for convenient use, while materials having the highest stabilities show limited electron-injection efficiencies.

To provide an organic EL device with a cathode having acceptable electron-injection efficiency and acceptable environmental stability, commonly-assigned U.S. Pat. No. 4,885,211 teaches the formation of a cathode of a combination of metals, with at least 50 percent (atomic basis) of the cathode being accounted for by a metal having a work function of less than 4.0 eV. Commonly-assigned U.S. Pat. No. 5,047,687 teaches the use of a cathode containing a plurality of metals, at least one of which is a low work function metal other than an alkali metal.

Commonly-assigned U.S. Pat. No. 5,677,572 discloses a bilayer electrode on an N-type semiconductor. This electrodes includes a non-conducting layer contacting the semiconductor and a conductive layer contacting the non-conducting layer. The materials and the thickness of the non-conducting layer are selected so that the bilayer forms a low resistance contact to the semiconductor, and provides a bilayer having acceptable stability against atmospheric corrosion. More particularly, U.S. Pat. No. 5,677,572 teaches that the non-conducting layer of the bilayer electrode can be selected from the group of alkali or alkaline earth fluorides or oxides, and the conductive layer can be selected from the group of elemental metals, metal alloys, nitrides, sulfides, and oxides. The non-conducting layer has a thickness in a range of 0.3–5.0 nanometer (nm).

U.S. Pat. No. 5,429,884 discloses an organic electroluminescent element having a transparent anode, a hole-carrying layer, a light-emitting layer, and an alloy cathode consisting of a first metal lithium and a stabilizing second metal aluminum, in which the concentration of the first metal lithium in the alloy region is controlled within a predetermined thickness from the interface between the alloy cathode and the organic layer. In a second embodiment, the first metal of an alloy cathode is stronthium and a stabilizing second metal is magnesium.

As evidenced by the aforementioned disclosures, substantial efforts have been made to provide improved electron-injection into an N-type semiconductor layer from an electrode, and to enhance the stability of such electrodes in organic EL devices.

In contrast to the disclosures in the above cited commonly-assigned U.S. Pat. Nos. 4,885,211; 5,047,687; and 5,677,572 and of Namiki et al U.S. Pat. No. 5,429,884 appear to be directed to an electron-injecting electrode in which a first electron-injecting component of the electrode is in contact with the N-type semiconductor, and a second component of the electrode serves to either stabilize the first component (such as in the case of the U.S. Pat. No. 5,429,884 device) or to provide an electrically conductive feature to the non-conducting first component (such as in the U.S. Pat. No. 5,677,572 bilayer electrode). Stated differently, the cathodes described by U.S. Pat. Nos. 4,885,211 and 5,047,687 comprise a mixture or an alloy of a low work function metal and a higher work function metal, wherein the mixture or alloy extends uniformly throughout the cathode from a surface of an N-type organic semiconductor to an upper surface of the cathode, while the non-conducting layer of the U.S. Pat. No. 5,677,5721 bilayer electrode contacting the N-type semiconductor extends between 0.3–5.0 nm in thickness therefrom, and the alloy region of the U.S. Pat. No. 5,429,884 cathode extends from above 0 nm to 150 nm in thickness from an organic light-emitting layer.

Ultra-thin layers in contact with a semiconductor surface are the subject of an ongoing debate and discussion among experts in this field to provide a better understanding of the electron-injection processes from interfacial layers which may be as thin as a few atomic dimensions.

SUMMARY OF THE INVENTION

It is an object of the present invention to provide efficient electron-injecting in organic EL devices.

This object is achieved in an organic electroluminescent (EL) device having a layered structure, comprising:
 a) an anode;
 b) an organic hole-transport layer in contact with the anode;
 c) an organic emitting layer having one surface thereof in contact with the hole-transport layer;
 d) an organic electron-transport layer in contact with a second surface of the emitting layer;
 e) an electron-injecting layer in contact with the electron-transport layer; and
 f) a cathode in contact with the electron-injecting layer, wherein the electron-injecting layer includes aluminum and at least one alkali halide or at least one alkaline earth halide.

The following advantages are obtained in the fabrication and operation of an organic EL device having the inventive electron-injecting contact formed between a device cathode and an organic electron-transport layer. Efficient electron-injection; improved electroluminescent efficiency; reduced device drive voltage; enhanced long term stability of the device during storage as well as during operation; and an increased choice among materials to form the cathode over the electron-injecting layer, including cathode materials which have heretofore been restricted for use in constructing anodes; due to the ultra-thin (less than 2 nm) structure of the electron-injecting layer. The electron-injecting layer is fully light-transmissive, therefore permitting light emission from the device through a light-transmissive cathode formed from chemically and environmentally stable light-transmissive materials. The present invention permits flexibility in the fabrication of the electron-injecting layer in that the aluminum constituent and the alkali or alkaline earth constituent of the electron-injecting layer can be co-deposited and, alternatively, can be sequentially deposited to form overlying thin layers (each thin layer having a thickness of less than 1 nm).

The drawings are necessarily of a schematic nature, since the thicknesses of the individual layers of the organic EL device are too thin, and thickness differences of the various layers are too great to permit depiction to scale or to permit convenient proportionate scaling.

DESCRIPTION OF THE PREFERRED EMBODIMENTS

In the ensuing detailed description of the four major embodiments of the invention (FIGS. 1–4), like parts and parts with like functions have been assigned corresponding numeral designations for ease of interpretation of the drawings and for the purpose of brevity of presentation. Accordingly, features common to all embodiments of the organic EL device in accordance with the present invention will be detailed with reference to FIG. 1, while highlighting the major differences between and among the four embodiments.

Figure 1:
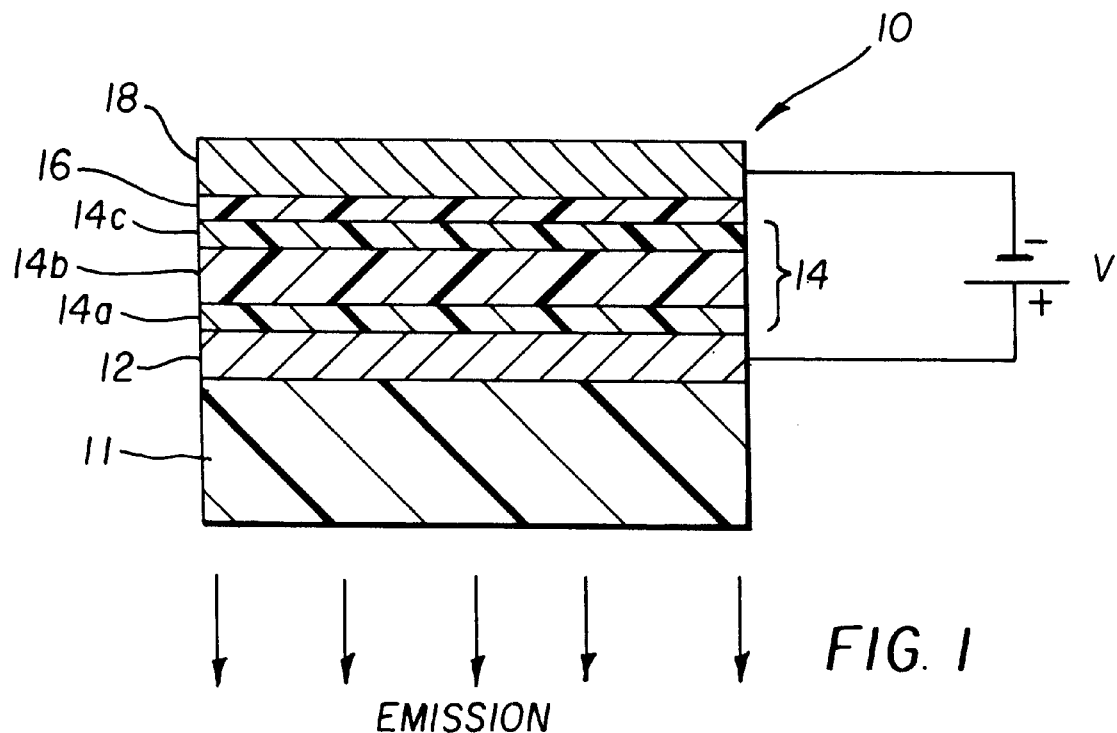
FIG. 1A is a schematic diagram of an organic EL device in accordance with a first embodiment of the invention, in which an electron-injecting layer is formed between a light-reflective cathode and an organic electron-transport layer of an EL medium structure, with light emission through a light-transmissive anode and a light-transmissive substrate.

Turning now to FIG. 1, an organic EL device 10 has a light-transmissive substrate 11 on which is disposed a light-transmissive anode 12. An organic light-emitting structure 14 is formed over the anode 12. The organic light-emitting structure 14 is comprised of, in sequence, an organic hole-transport layer 14a, an organic emitting layer 14b, and an organic electron-transport layer 14c. Provided over the electron-transport layer 14c is an electron-injecting layer 16, and a light-reflective cathode 18 is formed over the electron-injecting layer 16. When an electrical potential difference V is applied between the anode 12 and the cathode 18 such that the anode is at a more positive potential with respect to the cathode, the cathode 18 will inject electrons into the electron-injecting layer 16 which, in turn, will inject electrons into the organic electron-transport layer 14c of the EL medium structure 14. The electrons will traverse the electron-transport layer 14c, which is an organic N-type semiconductor and the electrons will further traverse the emitting layer 14b which is also capable of transporting electrons. At the same time, holes (positive charge carriers) will be injected from the anode 12 into the organic hole-transporting layer 14a and migrate thereacross. Recombination between the electrons and holes occurs at or near an interface between the layers 14a and 14b, such recombination resulting in a release of energy in the form of light which, as depicted in FIG. 1, is emitted through the light-transmissive anode 12 and through the light-transmissive substrate 11 for viewing by an observer. The cross-hatching of the cathode 18 is intended to indicate that the cathode is light-reflective, and it may also be optically opaque.

The light-transmissive substrate 11 can be constructed of glass, quartz, or a plastic material. The anode 12 is preferably constructed of one or a combination of like-transmissive and electrically conductive metal oxides such as indium oxide, tin oxide, or indium tin oxide (ITO). As employed herein, the term "light-transmissive" means that the layer or element under discussion transmits greater than 50 percent of the light of at least one wavelength it receives, and preferably over a 100 nm interval. In order to function as an effective hole-injecting electrode, the anode 12 must have a work function in excess of 4.0 eV. ITO has a work function of about 4.7 eV, is readily and integrally formed on a substrate, and is chemically and environmentally stable, as well as being substantially operation resistant.

The organic EL medium structure (also referred to as the organic light-emitting structure) 14 is preferably constructed by sequential vapor deposition of the hole-transport layer 14a, the emitting layer 14b, and the electron-transport layer 14c. Following the teachings of aforementioned commonly-assigned U.S. Pat. No. 4,539,507, the hole-transport layer 14a preferably contains at least one aromatic tertiary amine.

Both the organic emitting layer 14b and the organic electron-transport layer 14c are constructed by vapor deposition of organic materials which have electron-transporting properties, and which are capable of thin film formation. Thus, both the emitting layer 14b and the electron-transport layer 14c can be constructed from one or a combination of organic electron-transporting materials, with the emitting layer 14b additionally containing a dye capable of emitting light in response to hole-electron recombination.

Particularly preferred thin film forming materials for use in forming the electron-transport and emitting layers of the organic EL device 10 are metal chelated oxinoid compounds, including chelates of oxine itself (also commonly referred to as 8-quinolinol or 8-hydroxyquinoline). Such compounds exhibit both high levels of components and are readily fabricated in the form of thin films.

It is possible to modify the wavelength of emission from the emitting layer 14b and, in some instances, to increase the stability of the organic EL device in operation by incorporating in the emitting layer 14b a dye capable of emitting light in response to hole-electron recombination. In the above cited commonly-assigned U.S. Pat. No. 4,769,292, describe internal junction organic EL devices containing dyes selected from a variety of classes molecularly dispersed in electron-transport host materials.

The preferred active materials forming the organic EL medium structure 14 are each film-forming materials and capable of vacuum vapor deposition. Individual layer thicknesses of the organic layers of the EL medium structure 14 are in a preferred range of 10–200 nm. It is generally preferred that the overall thickness of the organic FL medium structure be at least about 100 nm.

It has been found quite unexpectedly that an ultra-thin layer, having a thickness of less than 2 nm, and comprising a mixture of aluminum and at least one alkali halide or at least one alkaline earth halide forms an efficient electron-injecting layer 16 when vapor deposited over the organic electron-transport layer 14c. prior to depositing the cathode 18. Preliminary observations further indicate that an effective electron-injecting layer 16 can be provided by sequential vapor deposition on the organic electron-transport layer 14c in either a sequence of a thin layer of aluminum followed by deposition of a thin layer of an alkali halide or an alkaline earth halide and, alternatively, in a reverse sequence, i.e., a thin layer of the alkali halide or the alkaline earth halide formed on the organic electron-transport layer 14c, followed by a thin layer of aluminum. In the sequential vapor deposition of the two respective thin layers, it has been observed that a thickness of less than 1 nm for each of the thin layers is sufficient to provide an effective electron-injecting layer 16. At a total thickness of less than 2 nm, the electron-injecting layer 16 is a light-transmissive layer.

Particularly suitable alkali halides are lithium fluoride, sodium fluoride, potassium fluoride, rubidium fluoride, and cesium fluoride, and suitable alkaline earth halides are magnesium fluoride, calcium fluoride, stronthium fluoride, and barium fluoride. The invention contemplates the incorporation of at least one of the alkali halides or at least one of the alkaline earth halides in the electron-injecting layer 16, together with the aforementioned aluminum.

As indicated previously, the organic electron-transport layer 24c can be a metal chelated oxinoid compound, here simply referred to as a metal chelate. Alternatively, the organic electron-transport layer 14c can be formed from a metal chelating compound which is capable of forming, at least throughout a portion of its thickness dimension, a metal chelate when a source of metal (particularly a source of metal vapor) is provided at the free surface of the layer of the metal chelating compound.

As indicated above, the light-transmissive anode 12 of FIG. 1 is preferably constructed of ITO. Other light-transmissive anodes can be fabricated from aluminum- or indium-doped zinc oxide, tin oxide, magnesium-indium-oxide, nickel-tungsten-oxide, and cadmium-tin-oxide. The light-reflective cathode 18 of FIG. 1 can be a light-reflective elemental metal or a light-reflective metal alloy. Since the electron-injecting layer 16 provides an effective electron-injection into the organic electron-transport layer 14c, the choice of reflective elemental metal or reflective metal alloy for forming the cathode can now encompass materials which have reflective properties and are also physically and chemically stable during storage and operation of the device 10. In fact, the invention specifically contemplates light-reflective elemental metal or metal alloy cathodes which, in the absence of the electron-injecting layer 16, could have only been considered as materials suitable for the anode of that device.

Emission of light is provided from the organic EL device 10 whenever a voltage source V provides a dry signal applied between the anode 12 and the cathode 18 such that the anode is at a positive potential relative to the cathode.

Figure 2:
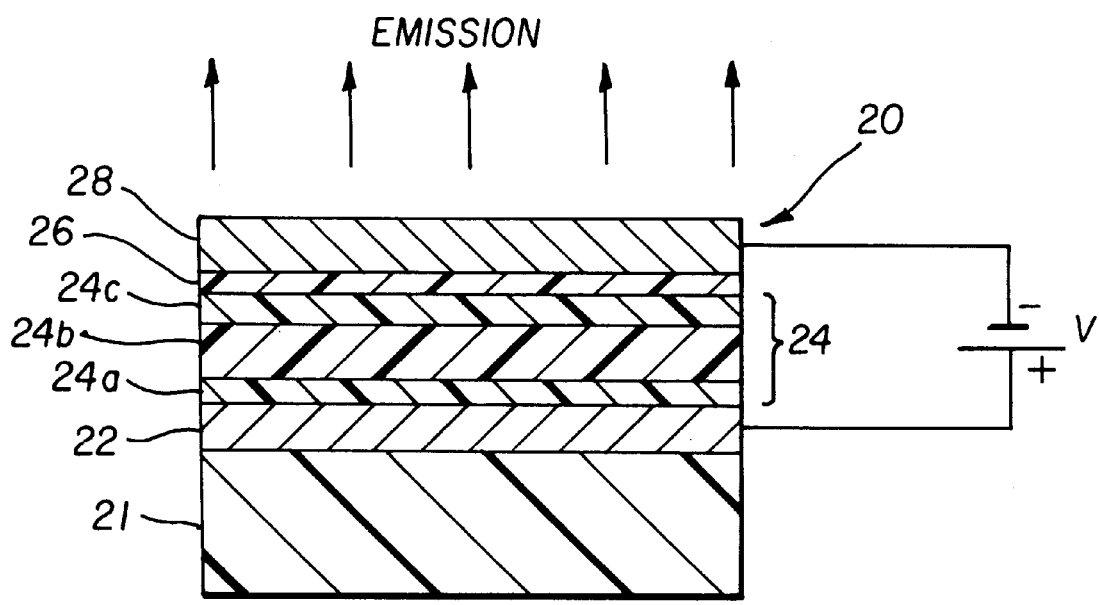
FIG. 2 is a schematic diagram of an organic EL device in accordance with a second embodiment of the invention, in which an electron-injecting layer is formed between a light-transmissive cathode and an organic electron-transport layer of an organic EL medium structure, and provided with a light-reflective anode, with light emission taking place through the cathode.

In FIG. 2, a second embodiment of an organic EL, device 20 in accordance with the present invention provides emission of light through a light-transmissive cathode 28, while an anode 22 is light-reflective as indicated by the cross-hatching. The substrate 21 can be a metal, a semiconductor such as silicon, or a ceramic substrate. The substrate can be optically opaque in this configuration. The electron-injecting layer 26 is disposed between the cathode 28 and an organic electron-transport layer 24c of an organic EL medium structure 24. All other features and functions of the organic EL device 20 are substantially identical to the features and functions described with reference to FIG. 1, including the selection of light-transmissive materials selected for constructing the cathode 28 previously described for the construction of the anode 12 of FIG. 1.

Figure 3:
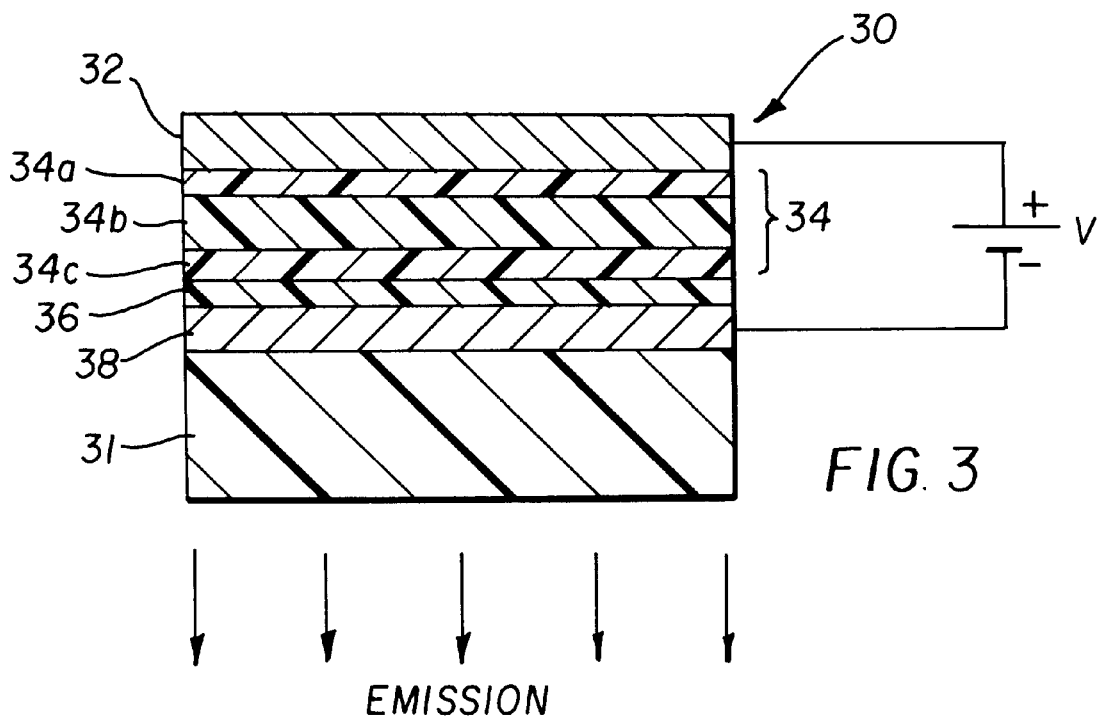
FIG. 3 is a schematic diagram of an organic EL, device in accordance with a third embodiment of the invention, in which an electron-injecting layer is formed between a light-transmissive cathode and an organic electron-transport layer of an organic EL medium structure, and having a light-reflective anode, with light emission occurring through the light-transmissive cathode and a light-transmissive substrate.

Referring now to FIG. 3, a third embodiment of an organic EL device 30 has a light-transmissive substrate 31 and a light-transmissive cathode 38 on one surface thereof. An electron-injecting layer 36 overlies the cathode 38 and is in contact with an organic electron-transport layer 34c of an organic EL medium structure 34 whose uppermost organic hole-transport layer 34a is in contact with a light-reflective anode 32. Light emission from the device 30 occurs when a voltage source V provides a drive signal applied between the anode 32 and the cathode 38 such that the anode is biased positively with respect to the cathode.

While light emission from the organic EL device 30 and from the device 10 of FIG. 1 occurs through the respective light-transmissive substrates 31 and 11, it will be noted that the construction and arrangement of the layered structure of the device 30 above the substrate 31 is inverted when compared to the layered structure of the device 10 of FIG. 1.

The light-transmissive cathode 38 can be constructed from electrically conductive and light-transmissive oxides previously mentioned in conjunction with the construction of the anode electrode 12 of the device 10 of FIG. 1, since the electron-injecting layer 36 provides for enhanced electron-injection efficiency into the organic electron-transport layer 34c from a cathode constructed of a material having a work function greater than 4 eV.

Figure 4:
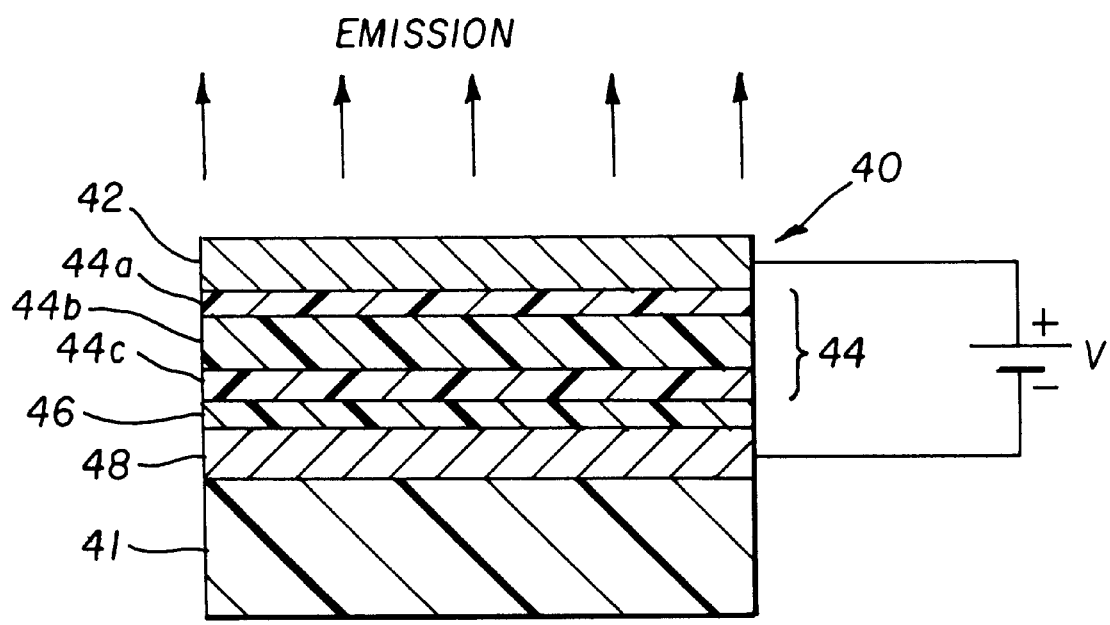
FIG. 4 is a schematic diagram of an organic EL device in accordance with a fourth embodiment of the present invention, in which an electron-injecting layer is formed between a light-reflective cathode and an organic electron-transport layer of an organic EL medium structure, with a light emission taking place through a light-transmissive anode.

Turning to FIG. 4, an organic EL device 40 provides a fourth embodiment of a device in accordance with the present invention. Here, a light emission occurs through a light-transmissive anode 42 when an appropriate dry voltage V is applied between the anode and a light-reflective cathode 48. As discussed previously with respect to the organic EL device 20 of FIG. 2, the substrate 41 can be made of a metal, a semiconductor, or a ceramic material, and the substrate 41 may be optically opaque. The cathode 48 is suitably constructed of a light-reflective elemental metal or of a light-reflective metal alloy. The light-transmissive anode 42 is constructed from any of the aforementioned electrically conductive and light-transmissive metal oxides.

Figure 5A:
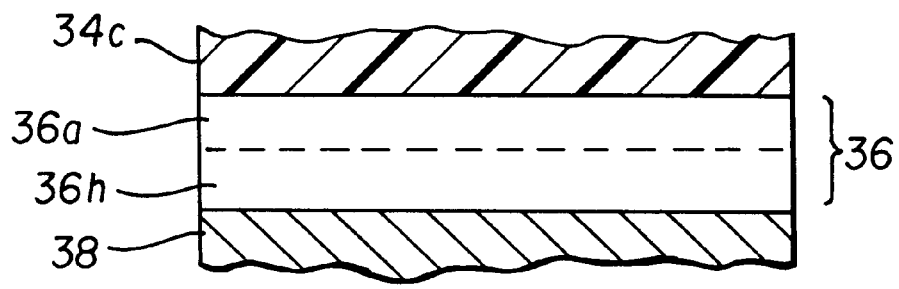
FIGS. 5A, 5B, and 5C are fractional schematic diagrams of different configurations of the construction of the electron-injecting layer disposed between the light-transmissive cathode and the organic electron-transport layer of the device shown in FIG. 3.
Figure 5B:
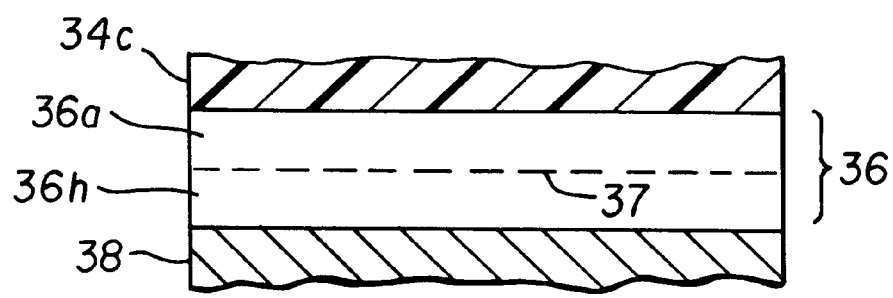
Figure 5C:
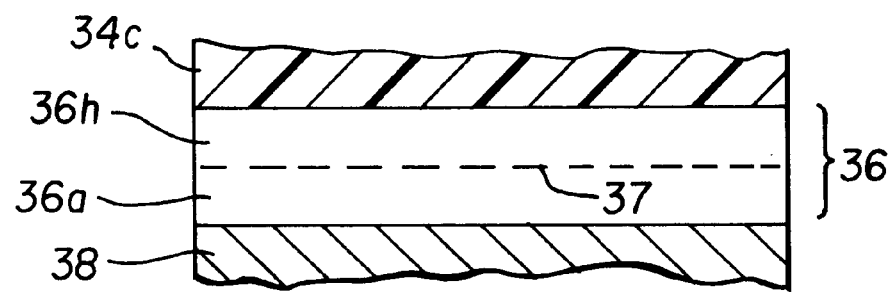

Turning now to FIGS. 5A, 5B, and 5C, enlarged fractional views of the electron-injecting layer 36 of the device 30 of FIG. 3 are depicted together with portions of the light-transmissive cathode 38 and the organic electron-transport layer 34c.

In FIG. 5A, the ultra-thin (less than 2 nm) electron-injecting layer 36 is comprised of a mixture on an atomic scale of aluminum (36a) and of a selected alkali halide or a selected alkaline earth halide (36h), the layer 36 having been formed by co-deposition of the aluminum and the respective halide either from independently controlled vapor deposition sources or from a composite deposition source. The atomic mixture of aluminum and an alkali halide or an alkaline earth halide is indicated by the term 36a+36h.

In FIG. 5B, an equally efficient electron-injecting layer 36 can be provided by sequential vapor deposition of an ultra-thin (less than 1 nm) layer of an alkali halide or of an alkaline earth halide 36h over the cathode 38, followed by deposition of an ultra-thin (less than 1 nm) layer of aluminum 36a, and followed by a vapor deposition of the organic electron-transport layer 34c. An imagined boundary line 37 is shown here merely for the purpose of indicating the sequential vapor deposition process used to form the electron-injecting layer 36, rather than to represent a clear and distinct boundary between the sequentially deposited thin layers, each of which has a thickness corresponding to a few atomic monolayers.

In FIG. 5C, an efficient electron-injecting layer 36 can also be formed by sequential deposition over the cathode 38 of a first ultra-thin (less than 1 nm) layer of aluminum 36a, followed by deposition of an ultra-thin (less than 1 nm) layer of an alkali halide or of an alkaline earth halide 36h, and followed by vapor deposition of the organic electron-transport layer 34c. As indicated above, the imagined boundary line 37 is intended to merely indicate the sequential deposition of the thin layers, rather than a discreet boundary between these layers.

The formation of an efficient electron-injecting layer 36 as schematically depicted in FIGS. 5A–5C is equally applicable to forming the electron-injecting layer in each of the aforementioned device embodiments in accordance with the invention.

The present invention contemplates an electron-injecting layer having a thickness of less than 2 nm and comprised of vapor deposited aluminum and more than one vapor deposited alkali halide such as, for example, a vapor deposited lithium fluoride and a vapor deposited cesium fluoride. Similarly, the present invention contemplates an efficient electron-injecting layer comprised of vapor deposited aluminum and more than one vapor deposited alkaline earth halide, such as, for example, magnesium fluoride and stronthium fluoride.

In forming the electron-injecting, layer, the layer is comprised of aluminum and at least one alkali halide selected from among lithium fluoride, sodium fluoride, potassium fluoride, rubidium fluoride, and cesium fluoride, and alternatively, comprised of aluminum and at least one alkaline earth halide selected from among magnesium fluoride, calcium fluoride, stronthium fluoride, and barium fluoride. In bulk form or in crystalline form, each of the aforementioned preferred alkali fluorides or alkaline earth fluorides is an electrical insulator, i.e., in bulk form these materials are electrically non-conductive. Furthermore, in bulk form or in crystalline form, a chemical reaction between aluminum and any one of the alkali fluorides or any one of the alkaline earth fluorides is considered to be thermodynamically unlikely. However, as evidenced by the efficient electron-injecting layer formed in any manner as depicted in FIGS. 5A, 5B, and 5C, is suggestive of chemical and/or physical interactions between the constituents of the layer of the ultra-thin layer.

EXAMPLES

EL devices of this invention were constructed in the following manner:

1. A glass substrate with a pre-patterned ITO layer was thoroughly cleaned using a commercial glass-plate cleaning tool, followed by an oxidative plasma treatment of the ITO surface.
2. Organic EL medium including a hole-transport layer (NPB) and an electron-transport and emissive layer (Alq) was deposited sequentially onto the ITO substrate by vacuum vapor deposition. The individual layer thickness was about 0.7 nanometer.
3. An electron-injection layer including a LiF layer and an Al layer was deposited onto the organic EL medium by vacuum vapor deposition. For LiF, the heating element for the vapor deposition was a resistively heated tantalum boat. For Al, the heating element was either an electron-beam source or an resistively heated tungsten boat. The rate of deposition was typically 0.05 to 0.1 nanometer for both LiF and Al layers.
4. The cathode metal (Ag) layer was deposited onto the electron-injecting layer by vacuum deposition using a resistively heated tantalum boat. The thickness of this layer was on the order of 100 nanometer.
5. The active area of the EL devices was 0.1 $cm^2$.

In Table 1, the characteristics of EL devices with various electron-injection contact configurations are compared.

TABLE 1

| | | | Characteristics of organic EL devices | | | | | |
|---|---|---|---|---|---|---|---|---|
| | Electron-injection layer thickness | | EL @ 2 $mA/cm^2$ | | | El @ 100 $mA/cm^2$ | | |
| | (nm) | | Voltage | L | Eff | Voltage | L | Eff |
| Ex | LiF | Al | (V) | ($cd/m^2$) | (cd/A) | (V) | ($cd/m^2$) | (cd/A) |
| 1 | 0.3 | 0 | 7.6 | <1 | <0.1 | 15.2 | <10 | <0.1 |
| 2 | 0.3 | 0.2 | 6.4 | 21.6 | 1.08 | 12.5 | 1523 | 1.52 |
| 3 | 0.3 | 0.3 | 4.2 | 68 | 3.39 | 8.9 | 3672 | 3.58 |
| 4 | 0.3 | 0.5 | 4.1 | 60.2 | 3.01 | 8.5 | 3236 | 3.24 |
| 5 | 0.3 | 0.7 | 4.1 | 58.4 | 2.92 | 9.9 | 3256 | 3.26 |
| 6 | 0.3 | 1.0 | 4.1 | 62.9 | 3.15 | 10.0 | 3220 | 3.22 |

In these examples, the LiF layer thickness was kept fixed at 0.3 nm while the Al layer thickness was varied from 0 to 1.0 nm. Ex. 1 is the control device without the Al layer. It can be seen that the EL characteristics of this control device are poor relative to the EL devices (Ex. 2–6) containing the Al layer. The drive voltages at high and low current densities are significantly lowered with an ultra-thin LiF/Al layer as the electron-injecting contact. The EL luminance and luminance efficiency are dramatically increased with the LiF/Al electron-injecting contact.

Similar effects have been observed with other high work-function cathode materials such as Au.

The invention has been described in detail with particular reference to certain preferred embodiments thereof, but it will be understood that variations and modifications can be effected within the spirit and scope of the invention.

Parts List 10 organic EL device
11 light-transmissive substrate
12 light-transmissive anode
14 organic EL medium structure/organic light-emitting structure
14a organic hole transport layer
14b organic emitting layer
14c organic electron-transport layer
16 electron-injecting layer
18 light-reflective cathode
20 organic EL device
21 substrate
22 light-reflective anode
24 organic EL medium structure
24a organic hole-transport layer
24b organic emitting layer
26c organic electron-transport layer
26 electron-injecting layer
28 light-transmissive cathode
30 organic EL device
31 light-transmissive substrate
32 light-reflective anode
34 organic EL medium structure
34a organic hole-transport layer
34b organic emitting layer
34c organic electron-transport layer
36 electron-injecting layer
36a aluminum thin layer
Parts List Cont'd
36h halide thin layer
37 imagined boundary line
38 light-transmissive cathode
40 organic EL device
41 substrate
42 light-transmissive anode
44 organic EL medium structure
44a organic hole-transport layer
44b organic emitting layer
44c organic electron-transport layer
46 electron-injecting layer
48 light-reflective cathode
V voltage source

What is claimed is:

1. An organic electroluminescent (EL) device having a layered structure, comprising:
    a) an anode;
    b) an organic hole-transport layer in contact with the anode;
    c) an organic emitting layer having one surface thereof in contact with the hole-transport layer;
    d) an organic electron-transport layer in contact with a second surface of the emitting layer;
    e) an electron-injecting layer in contact with the electron-transport layer; and
    f) a cathode in contact with the electron-injecting layer,
    wherein the electron-injecting layer includes aluminum and at least one alkali halide or at least one alkaline earth halide.

2. The organic EL device of claim 1, wherein the electron-injecting layer comprises:
    a) a layer of alkali halide or alkaline earth halide in contact with the organic electron-transport layer; and
    b) a layer of aluminum.

3. The organic EL device of claim 1, wherein the electron-injecting layer includes a mixture of aluminum and an alkali halide or an alkaline earth halide.

4. The organic EL device of claim 2, wherein the thickness of the layer of alkali halide or of alkaline earth halide is less than 1 nanometer (nm), and the thickness of the layer of aluminum is less than 1 nm.

5. The organic EL device of claim 3, wherein the electron-injecting layer has a thickness of less than 2 nm.

6. The organic EL device of claim 1, wherein the electron-injecting layer is light-transmissive.

7. The organic EL device of claim 1, further including a substrate having disposed on one surface thereof the cathode or the anode.

8. The organic EL device of claim 7, wherein the substrate is light-transmissive, and the cathode disposed on the one surface thereof and is light-transmissive, and the anode is in contact with the hole-transport layer and is light-reflective.

9. The organic EL device of claim 7, wherein the substrate is light-transmissive, and the anode is disposed on the one surface thereof and is light-transmissive, and the cathode is contact with the electron-injecting layer and is light-reflective.

10. The organic EL device of claim 8, wherein the light-transmissive cathode is selected from the group consisting of indium-tin-oxide, aluminum- or indium-doped zinc oxide, tin oxide, magnesium-indium-oxide, nickel-tungsten-oxide, and cadmium-tin-oxide.

11. The organic EL device of claim 8, wherein the light-reflective anode is selected from the group consisting of light-reflective elemental metal, and light-reflective metal alloys.

12. The organic EL device of claim 9, wherein the light-reflective anode is selected from the group consisting of indium-tin-oxide, aluminum- or indium-doped zinc oxide, tin oxide, magnesium-indium-oxide, nickel-tungsten-oxide, and cadmium-tin-oxide.

13. The organic EL device of claim 9, wherein the light-reflective cathode is selected from the group consisting of a light-reflective elemental metal, and light-reflective metal alloys.

14. The organic EL device of claim 1, wherein the organic electron-transport layer is comprised of a metal chelate or of a metal chelating compound.

15. An organic electroluminescent (EL) device having a layered structure, comprising:
    a) a light-transmissive substrate;
    b) a light-transmissive cathode disposed on one surface of the substrate;
    c) an electron-injecting layer having one surface thereof in contact with the cathode;
    d) an organic electron-transport layer in contact with a second surface of the electron-injecting layer;
    e) an organic emitting layer having one surface thereof in contact with the electron-transport layer;
    f) an organic hole-transport layer in contact with a second surface of the emitting layer; and
    g) a light-reflective anode in contact with the hole-transport layer,
    wherein the electron-injecting layer includes aluminum and at least one alkali halide or at least one alkaline earth halide, and the electron-injecting layer has a thickness of less than 2 nanometer (nm).

16. The organic EL device of claim 15, wherein the electron-injecting layer includes a mixture of aluminum and the at least one alkali halide or the at least one alkaline earth halide.

17. The organic EL device of claim 15, wherein the electron-injecting layer is light-transmissive.

18. The organic EL device of claim 15, wherein the light-transmissive cathode is selected from the group consisting of indium-tin-oxide, aluminum- or indium-doped zinc oxide, tin oxide, magnesium-indium-oxide, nickel-tungsten-oxide, and cadmium-tin-oxide.

19. The organic EL device of claim 15, wherein the light-reflective anode is selected from the group consisting of light-reflective elemental metal, and light-reflective metal alloys.

20. The organic EL device of claim 15, wherein the organic electron-transport layer includes a metal chelate or of a metal chelating compound.

21. The organic EL device of claim 1, wherein the at least one alkali halide is selected from the group consisting of lithium fluoride, sodium fluoride, potassium fluoride, rubidium fluoride, and cesium fluoride.

22. The organic EL device of claim 1, wherein the at least one alkaline earth halide is selected from the group consisting of magnesium fluoride, calcium fluoride, stronthium fluoride, and barium fluoride.

23. The organic EL device of claim 15, wherein the at least one alkali halide is selected from the group consisting of lithium fluoride, sodium fluoride, potassium fluoride, rubidium fluoride, and cesium fluoride.

24. The organic EL device of claim 15, wherein the at least one alkaline earth halide is selected from the group consisting of magnesium fluoride, calcium fluoride, stronthium fluoride, and barium fluoride.

25. An organic electroluminescent (EL) device having a layered structure, comprising:

a) a light-transmissive substrate;

b) a light-transmissive anode disposed on one surface of the substrate;

c) an organic hole-transport layer in contact with the anode;

d) an organic emitting layer having one surface thereof in contact with the hole-transport layer;

e) an organic electron-injecting transport layer in contact with a second surface of the emitting layer;

f) an electron-injecting layer in contact with the electron-transport layer; and g) a light-reflective cathode in contact with the electron-injecting layer, wherein the electron-injecting layer includes aluminum and at least one alkali halide or at least one alkaline earth halide, and the electron-injecting layer has a thickness of less than 2 nanometer (nm).

26. The organic EL device of claim 25, wherein the electron-injecting layer comprises:

a) a layer of the at least one alkali halide or of the at least one alkaline earth halide in contact with the organic electron-transport layer; and b) a layer of aluminum.

27. The organic EL device of claim 25, wherein the electron-injecting layer comprises a mixture of aluminum and the at least one alkali halide or the at least one alkaline earth halide.

28. The organic EL device of claim 26, wherein the thickness of the layer of alkali halide or of alkaline earth halide is less than 1 nanometer (nm), and the thickness of the layer of aluminum is less than 1 nm.

29. The organic EL device of claim 25, wherein the electron-injecting layer includes a mixture of aluminum and the at least one alkali halide or the at least one alkaline earth halide.

30. The organic EL device of claim 25, wherein the substrate is light-transmissive anode is selected from the group consisting of indium-tin-oxide, aluminum- or indium-doped zinc oxide, tin oxide, magnesium-indium-oxide, nickel-tungsten-oxide, and cadmium-tin-oxide.

31. The organic EL device of claim 25, wherein the light-reflective cathode is selected from the group consisting of light-reflective elemental metal, and light-reflective metal alloys.

32. The organic EL device of claim 25, wherein the organic electron-transport layer includes a metal chelate or of a metal chelating compound.

33. The organic EL device of claim 25, wherein the at least one alkali halide is selected from the group consisting of lithium fluoride, sodium fluoride, potassium fluoride, rubidium fluoride, and cesium fluoride.

34. The organic EL device of claim 25, wherein the at least one alkaline earth halide is selected from the group consisting of magnesium fluoride, calcium fluoride, stronthium fluoride, and barium fluoride.

35. An organic electroluminescent (EL) device having a layered structure, comprising:

a) a substrate;

b) a first electrode on one surface of the substrate;

c) a layered organic EL medium structure disposed on the first electrode;

d) a second electrode in contact with the layered organic EL medium structure; and e) an electron-injecting layer disposed between the first electrode and the layered organic EL medium structure and alternatively between the layered organic EL medium structure and the second electrode, wherein the electron-injecting layer includes aluminum and at least one alkali halide or at least one alkaline earth halide.

36. The organic EL device of claim 35, wherein the substrate is light-transmissive, the first electrode is a light-transmissive cathode, and the electron-injecting layer is disposed between the first electrode and the layered organic EL medium structure.

37. The organic EL device of claim 36, wherein the layered organic EL medium structure includes an organic electron-transport layer over the electron-injecting layer, an organic emitting layer over the electron-transport layer, and an organic hole-transport layer over the emitting layer.

38. The organic EL device of claim 37, wherein the second electrode is a light-reflective anode selected to inject holes into the hole-transport layer.

39. The organic EL device of claim 35, wherein the substrate is light-transmissive, the first electrode is a light-transmissive anode, and the electron-injecting layer is disposed between the layered organic EL medium structure and the second electrode.

40. The organic EL device of claim 39, wherein the layered organic EL medium structure includes an organic electron-transport layer over the first electrode, an organic emitting layer over the hole-transport layer, and an organic electron-transport layer over the emitting layer.

41. The organic EL device of claim 40, wherein the second electrode is a light-reflective cathode selected to inject electrons into the electron-transport layer through the electron-injecting layer.

42. The organic EL device of claim 35, wherein the electron-injecting layer is light-transmissive and has a thickness of less than 2 nanometer (nm).

43. The organic EL device of claim 35, wherein the electron-injecting layer comprises:
   a) a layer of the at least one alkali halide or of the at least one alkaline earth halide in contact with the organic electron-transport layer; and
   b) a layer of aluminum.

44. The organic EL device of claim 35, wherein the electron-injecting layer includes a mixture of aluminum and the at least one alkali halide or the at least one alkaline earth halide.

45. The organic EL device of claim 43, wherein the thickness of the layer of alkali halide or of alkaline earth halide is less than 1 nanometer (nm), and the thickness of the layer of aluminum is less than 1 nm.

46. The organic EL device of claim 44, wherein the electron-injecting layer has a thickness of less than 2 nanometer (nm).

47. The organic EL device of claim 35, wherein the at least one alkali halide is selected from the group consisting of lithium fluoride, sodium fluoride, potassium fluoride, rubidium fluoride, and cesium fluoride.

48. The organic EL device of claim 35, wherein the at least one alkaline earth halide is selected from the group consisting of magnesium fluoride, calcium fluoride, stronthium fluoride, and barium fluoride.

* * * * *